United States Patent
Tsai et al.

(10) Patent No.: US 7,718,494 B2
(45) Date of Patent: May 18, 2010

(54) METHOD FOR FORMING HIGH-DRAIN-VOLTAGE TOLERANCE MOSFET TRANSISTOR IN A CMOS PROCESS FLOW WITH DOUBLE WELL DOSE APPROACH

(75) Inventors: Yung Chih Tsai, Jhudong (TW); Michael Yu, Taichung (TW); Chih-Ping Chao, Hsin-Chu (TW); Chih-Sheng Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 11/784,721

(22) Filed: Apr. 9, 2007

(65) Prior Publication Data

US 2008/0248623 A1  Oct. 9, 2008

(51) Int. Cl.
*H01L 21/8234* (2006.01)

(52) U.S. Cl. .................... 438/275; 438/286; 438/217; 438/231; 438/232; 438/919; 257/391; 257/392; 257/409; 257/500; 257/553; 257/E27.064

(58) Field of Classification Search ................ 438/275, 438/286, 217, 231, 232, 919; 257/391, 392, 257/409, 500, 553, E27.064
See application file for complete search history.

(56) References Cited

U.S. PATENT DOCUMENTS

| | | | | |
|---|---|---|---|---|
| 4,592,129 A | * | 6/1986 | Legge | ................... 438/72 |
| 4,928,159 A | * | 5/1990 | Mihara et al. | ............... 257/370 |
| 5,675,168 A | * | 10/1997 | Yamashita et al. | .......... 257/355 |
| 6,548,874 B1 | | 4/2003 | Efland et al. | |

* cited by examiner

*Primary Examiner*—Alexander G Ghyka
*Assistant Examiner*—Leonard Chang
(74) *Attorney, Agent, or Firm*—Slater & Matsil, L.L.P.

(57) ABSTRACT

A method for forming a high-voltage drain metal-oxide-semiconductor (HVD-MOS) device includes providing a semiconductor substrate; forming a well region of a first conductivity type; and forming an embedded well region in the semiconductor substrate and only on a drain side of the HVD-MOS device, wherein the embedded region is of a second conductivity type opposite the first conductivity type. The step of forming the embedded well region includes simultaneously doping the embedded well region and a well region of a core regular MOS device, and simultaneously doping the embedded well region and a well region of an I/O regular MOS device, wherein the core and I/O regular MOS devices are of the first conductivity type. The method further includes forming a gate stack extending from over the embedded well region to over the well region.

16 Claims, 12 Drawing Sheets

METHOD FOR FORMING HIGH-DRAIN-VOLTAGE TOLERANCE MOSFET TRANSISTOR IN A CMOS PROCESS FLOW WITH DOUBLE WELL DOSE APPROACH

TECHNICAL FIELD

This invention is related generally to semiconductor devices, and more particularly to the structures and formation methods of MOS devices that can tolerate high drain voltages.

BACKGROUND

In integrated circuits there is often the need to have a number of different operating voltages. MOS devices are typically operated at nominal voltages Vdd. In some instances, such as power management circuits, the circuits might need to be operated at voltages in excess of Vdd of the circuits. In these cases, high-voltage drain metal-oxide-semiconductor (HVD-MOS) devices capable of operating at high voltages on the drain side are required.

Figure 1:
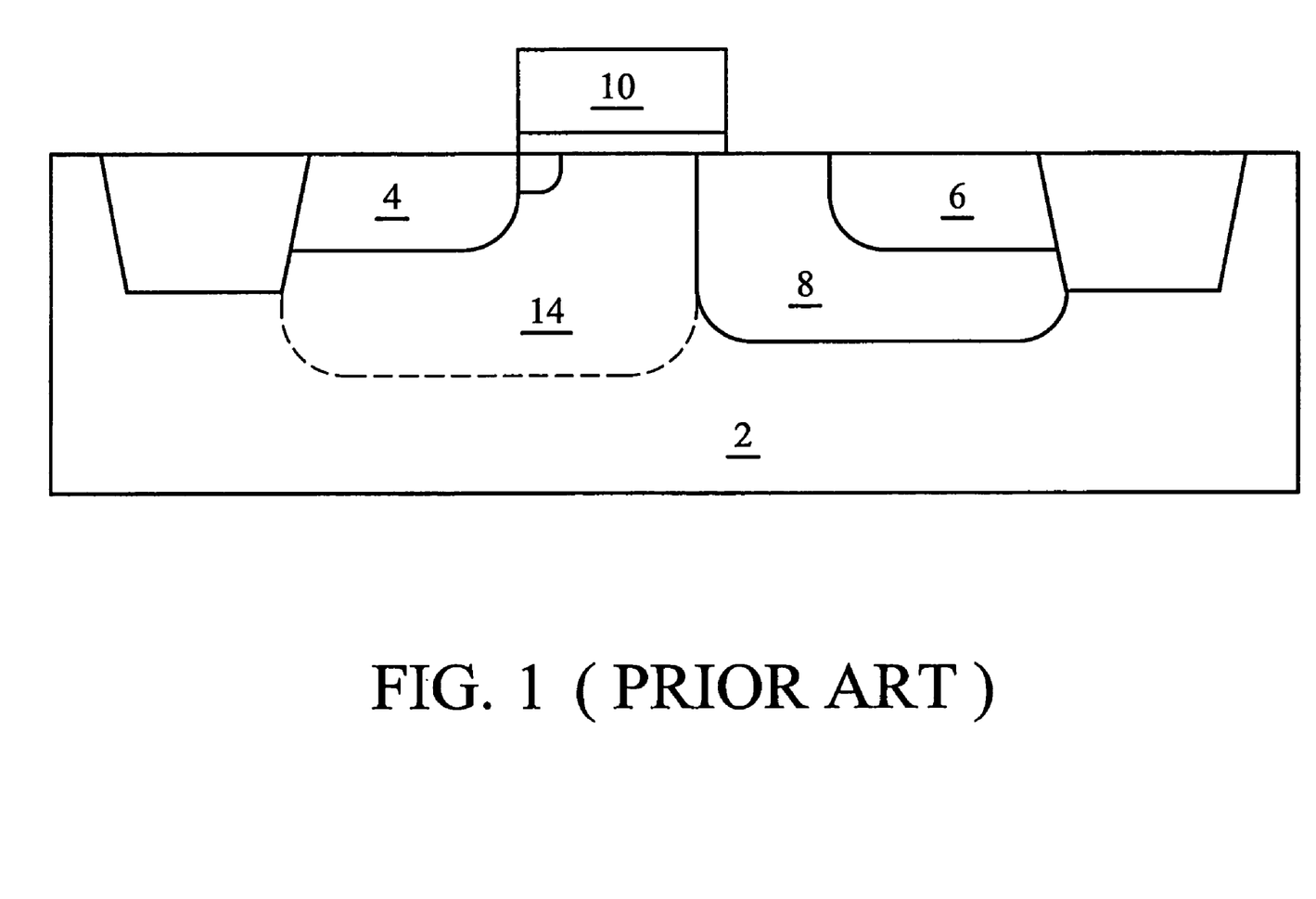
FIG. 1 illustrates a conventional high-voltage drain metal-oxide-semiconductor (HVD-MOS) device.

FIG. 1 illustrates a conventional HVD-MOS device, which includes a source region 4, a drain region 6 and a very lightly-doped drain extension region 8. Drain extension region 8 preferably extends under gate 10. Typically, drain extension region 8 has an impurity concentration several orders lower than typical lightly-doped source/drain (LDD) regions. The depth of the drain extension region 8 is also greater. Source region 4, drain region 6 and drain extension region 8 are formed in substrate 2. A well region 14, which has a different conductivity type than source and drain regions 4 and 6, may be formed adjacent to drain extension region 8 and extending toward the source side.

HVD-MOS devices may be used in applications where the voltage on the drain exceeds the normal voltage rating of the gate oxide. HVD-MOS devices differ from regular self-aligned MOS devices in that they use a very lightly-doped extension region, which depletes at high drain voltages. This allows much of voltage to be dropped across the extension region, and thus reduces the electric field across the gate oxide to a safe level. HVD-MOS devices are suitable for power amplifiers and power conditioning circuits, and are generally more robust than conventional MOS devices having the same thickness of gate dielectric. In particular, it is not necessary to add extra drain implants to control channel hot carrier (CHC) effects, and the higher breakdown voltage simplifies circuit design if HVD-MOS devices are used for electrostatic discharge (ESD) protection. For example, with HVD-MOS devices being used, it is normally unnecessary to include resistors in series with application specific integrated circuit (ASIC) outputs.

Typically, to incorporate HVD-MOS devices into a CMOS integrated circuit, additional and special processes are required. These processes add cost and complexity to the manufacturing process of the integrated circuit. Further processes with lower cost and less complexity are thus needed.

SUMMARY OF THE INVENTION

In accordance with one aspect of the present invention, a method for forming a high-voltage drain metal-oxide-semiconductor (HVD-MOS) device includes providing a semiconductor substrate; forming a well region of a first conductivity type; and forming an embedded well region in the semiconductor substrate and only on a drain side of the HVD-MOS device, wherein the embedded region is of a second conductivity type opposite the first conductivity type. The step of forming the embedded well region includes simultaneously doping the embedded well region and a well region of a core regular MOS device, and simultaneously doping the embedded well region and a well region of an I/O regular MOS device, wherein the core and I/O regular MOS devices are of the first conductivity type. The method further includes forming a gate stack extending from over the embedded well region to over the well region.

In accordance with another aspect of the present invention, a method of forming a semiconductor structure includes providing a semiconductor substrate comprising a first region and a second region; forming a core high-voltage drain metal-oxide-semiconductor (HVD-MOS) device in the first region and an I/O HVD-MOS device comprising forming a first well region in the first region; forming a second well region in the second region, wherein the first and the second well regions are of a first conductivity type; forming a first embedded well region only on a drain side of the core HVD-MOS device; and forming a second embedded well region only on a drain side of the I/O HVD-MOS device, wherein the first and the second embedded well regions are of a second conductivity type opposite the first conductivity type. The steps of forming the first and the second embedded well regions include simultaneously doping the first and the second embedded well regions and a well region of a core regular MOS device, wherein the core regular MOS device is of the first conductivity type, and simultaneously doping the first and the second embedded well regions and a well region of an I/O regular MOS device wherein the I/O regular MOS device is of the first conductivity type. The method further includes forming a first gate stack over and extending from the first embedded well region to the first well region and forming a second gate stack over and extending from the second embedded well region to the second well region.

In accordance with yet another aspect of the present invention, a semiconductor structure includes a semiconductor substrate comprising a first region, a second region and a third region, a first well region of a first conductivity type in the first region; a first embedded well region of a second conductivity type in the first region, wherein the first embedded well region adjoins the first well region and wherein the second conductivity type is opposite the first conductivity type; a gate stack partially overlapping the first well region and the first embedded well region; a first source region of the second conductivity type adjacent to the gate stack and substantially in the first well region; a first drain region of the second conductivity type adjacent to the gate stack and substantially in the first embedded well region; a second well region of the second conductivity type in the second region; a core regular MOS device at the surface of the second region, wherein a channel region of the core regular MOS device is in the second well region; a third well region of the second conductivity type in the third region; and an I/O regular MOS device at the surface of the third region, wherein a channel region of the I/O regular MOS device is in the third well region. The impurities of the second conductivity type in the first embedded region have a first concentration. The impurities of the second conductivity type in the second well region have a second concentration. The impurities of the second conductivity type in the third well region have a third concentration. The first concentration substantially equals the sum of the second concentration and the third concentration.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 7 are cross-sectional views of intermediate stages in the manufacturing of a p-type core HVD-MOS device and a p-type I/O HVD-MOS device;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing the proposed high-voltage drain metal-oxide-semiconductor (HVD-MOS) devices are illustrated. The formation of p-type HVD-MOS (HVD-PMOS) devices is used as an example to explain the concept of the present invention. The variations of the preferred embodiments are then discussed. Throughout the various views and illustrative embodiments of the present invention, like reference numbers are used to designate like elements.

Figure 2:
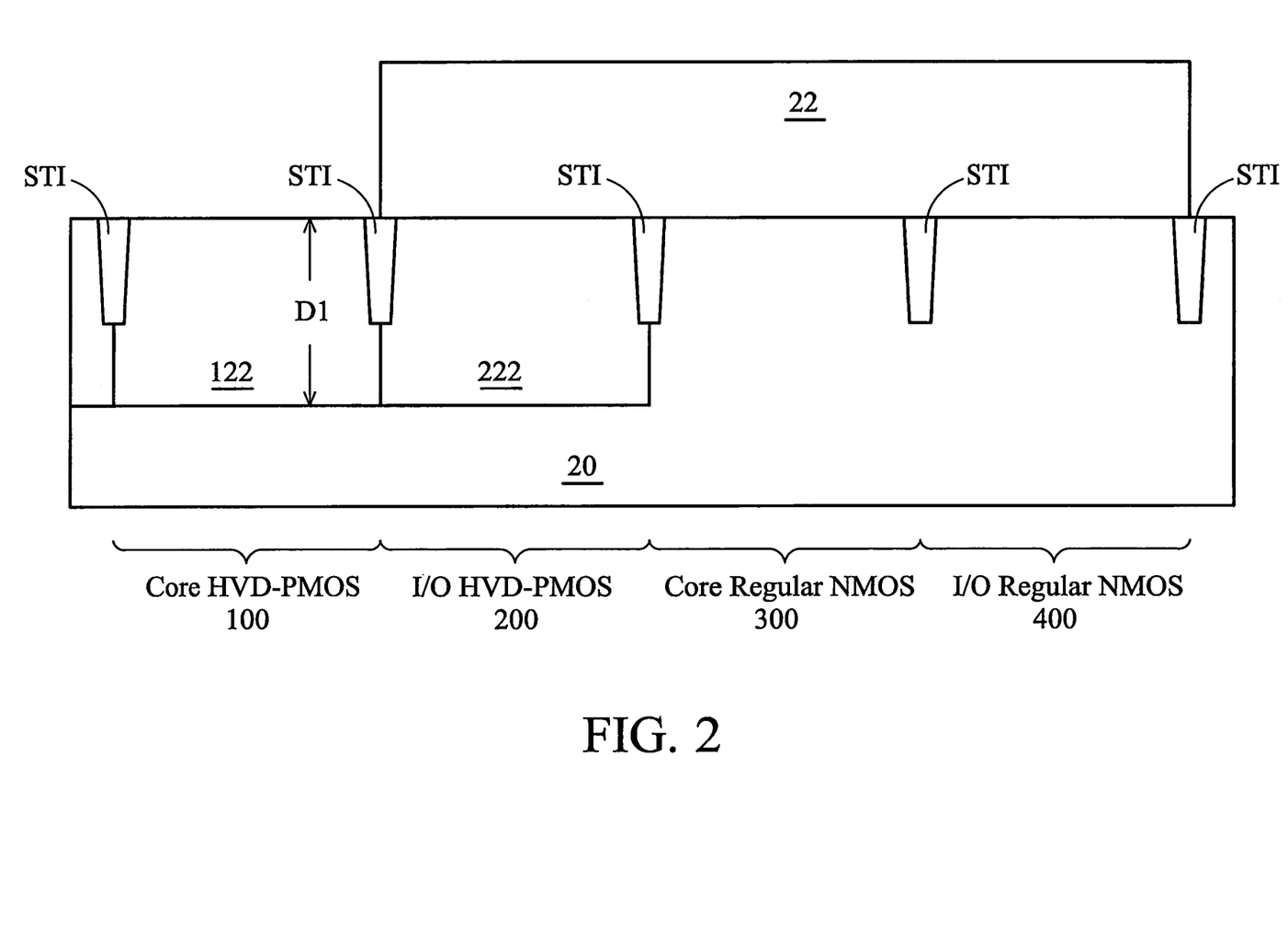

Referring to FIG. 2, a substrate 20 is provided. Substrate 20 is preferably formed of a semiconductor material such as silicon, although other semiconductor materials may be used. Substrate 20 is preferably of p-type. Alternatively, an n-type substrate may be used.

Substrate 20 includes four regions, a region 100 for forming a core HVD-PMOS device, a region 200 for forming an input/output (I/O) HVD-PMOS device, a region 300 for forming a core regular NMOS device, and a region 400 for forming an I/O regular NMOS device. Please note that the term "regular" is a term of art, and is used to refer to MOS devices that are operated at lower drain voltages as compared to HVD-MOS devices throughout the description. The term "core" is used to refer to devices with thin gate dielectrics, while the term "I/O" is used to refer to devices with thick gate dielectrics. The term "regular" may also be used to refer to those devices whose source and drain regions are substantially symmetric. Each of the regions 100, 200, 300 and 400 are preferably defined by insulation regions such as shallow trench isolation (STI) regions. Alternatively, field oxides can be formed as insulation regions.

A photo resist 22 is formed covering regions 200, 300 and 400. The exposed region 100 is preferably doped to form an N-well region 122. As is known in the art, the formation of the N-well region 122 preferably includes several implanting steps, each being performed at a different energy from the others, so that the impurity concentration is more uniform at different depths. The depth of N-well region 122 is denoted as D1. N-well region 122 preferably comprises antimony, arsenic, phosphorus, and/or other n-type impurities, and is implanted with a preferred dosage of between about $1E11/cm^2$ and about $5E13/cm^2$. Preferably, N-well region 122 is implanted simultaneously with a region 500 (not shown in FIG. 2, please refer to FIGS. 6A through 6C), which forms an N-well region 522 for forming a core regular PMOS device. Photo resist 22 is then removed. Similarly, a photo resist (not shown) is formed to mask regions 100, 300 and 400, and an N-well region 222 is implanted. N-well region 222 is preferably implanted simultaneously with a region 600 (not shown in FIG. 2, please refer to FIGS. 6A through 6C), which forms an N-well region 622 for forming a core regular PMOS device.

Figure 3:
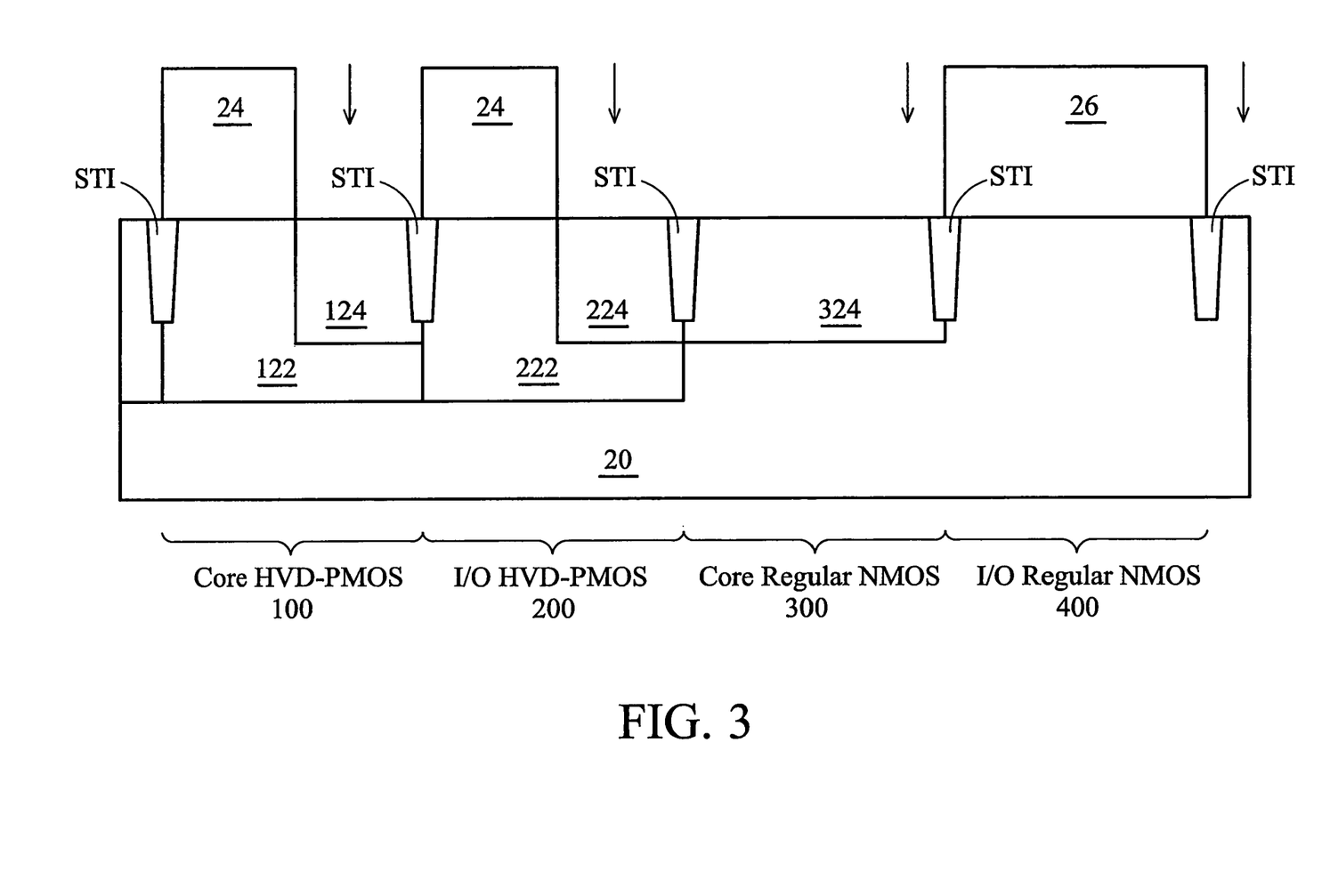

Referring to FIG. 3, a photo resist 24 is formed. Photo resist 24 masks I/O regular NMOS region 400 and leaves core regular NMOS region 300 open. In addition, a drain portion of region 100 and a drain portion of region 200 are opened. P-type impurities, for example, boron and/or indium, may be implanted at a dosage of about $1E11/cm^2$ to about $5E13/cm^2$. The implantation results in a P-well region 324 for forming a core regular NMOS device and embedded P-well regions 124 and 224 for forming the drain regions of the core and I/O HVD-MOS devices. Photo resist 24 is then removed.

Figure 4:
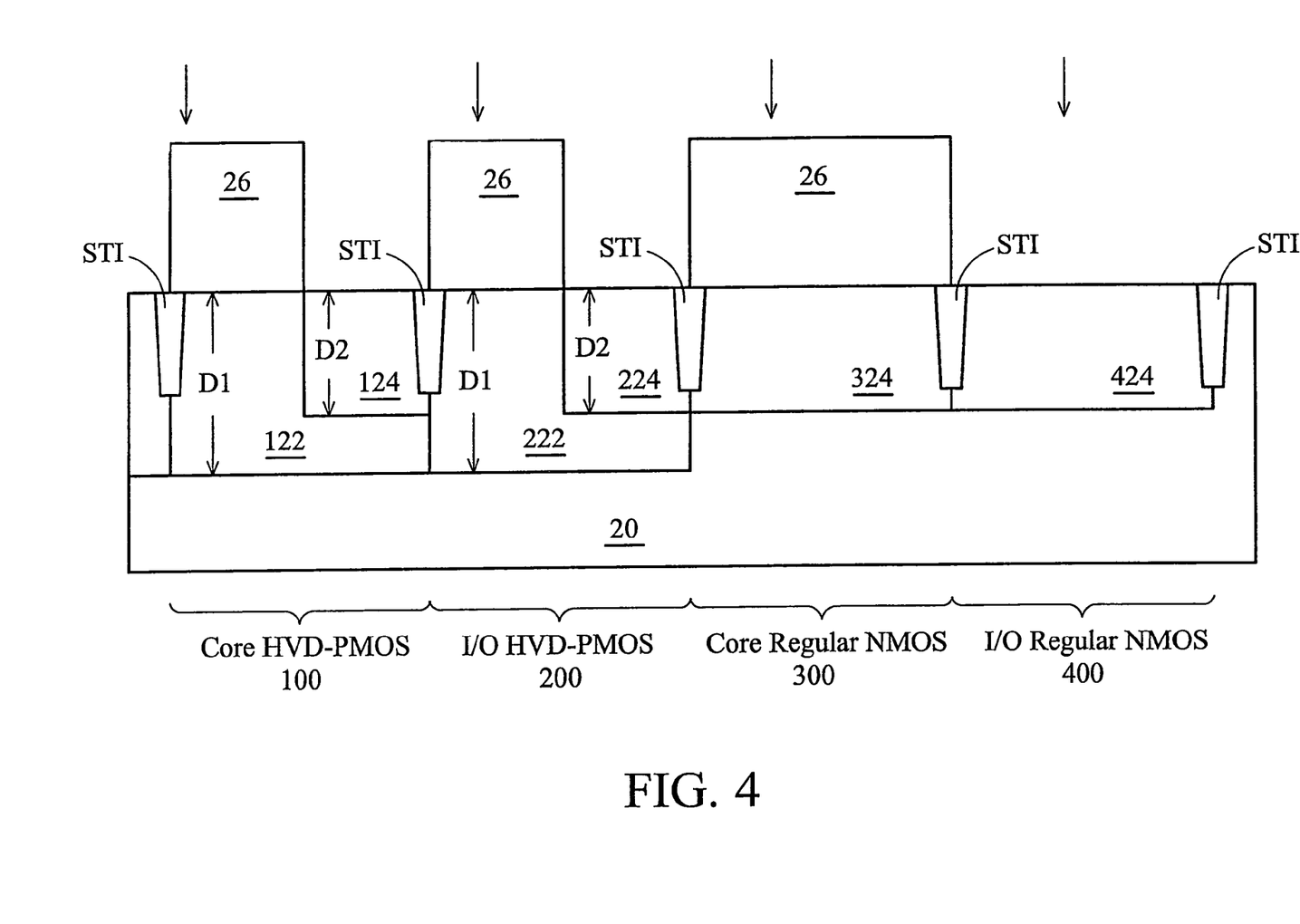

Referring to FIG. 4, a photo resist 26 is formed to mask core regular NMOS region 300, while I/O regular NMOS region 400 is left open. In addition, essentially the same drain portions in regions 100 and 200 are exposed through photo resist 26 as photo resist 24 (refer to FIG. 3). P-type impurities, for example, boron and/or indium, may be implanted at a dosage of about $1E11/cm^2$ to about $5E13/cm^2$. Embedded P-well regions 124 and 224 are thus double-dosed. As embedded well regions 124 and 224 are of a same conductivity type as substrate 20, they are preferably electrically isolated from substrate 20. Therefore, embedded well regions 124 and 224 preferably have a depth D2 less than a depth D1 of N-well regions 122 and 222, so that N-well regions 122 and 222 are used as separation regions between p-type regions. To make depth D1 greater than D2, the implanting of N-well regions 122 and 222 preferably includes additional implantation steps with higher energies to extend N-well regions 122 and 222 deeper. Photo resist 26 is then removed.

Figure 5:
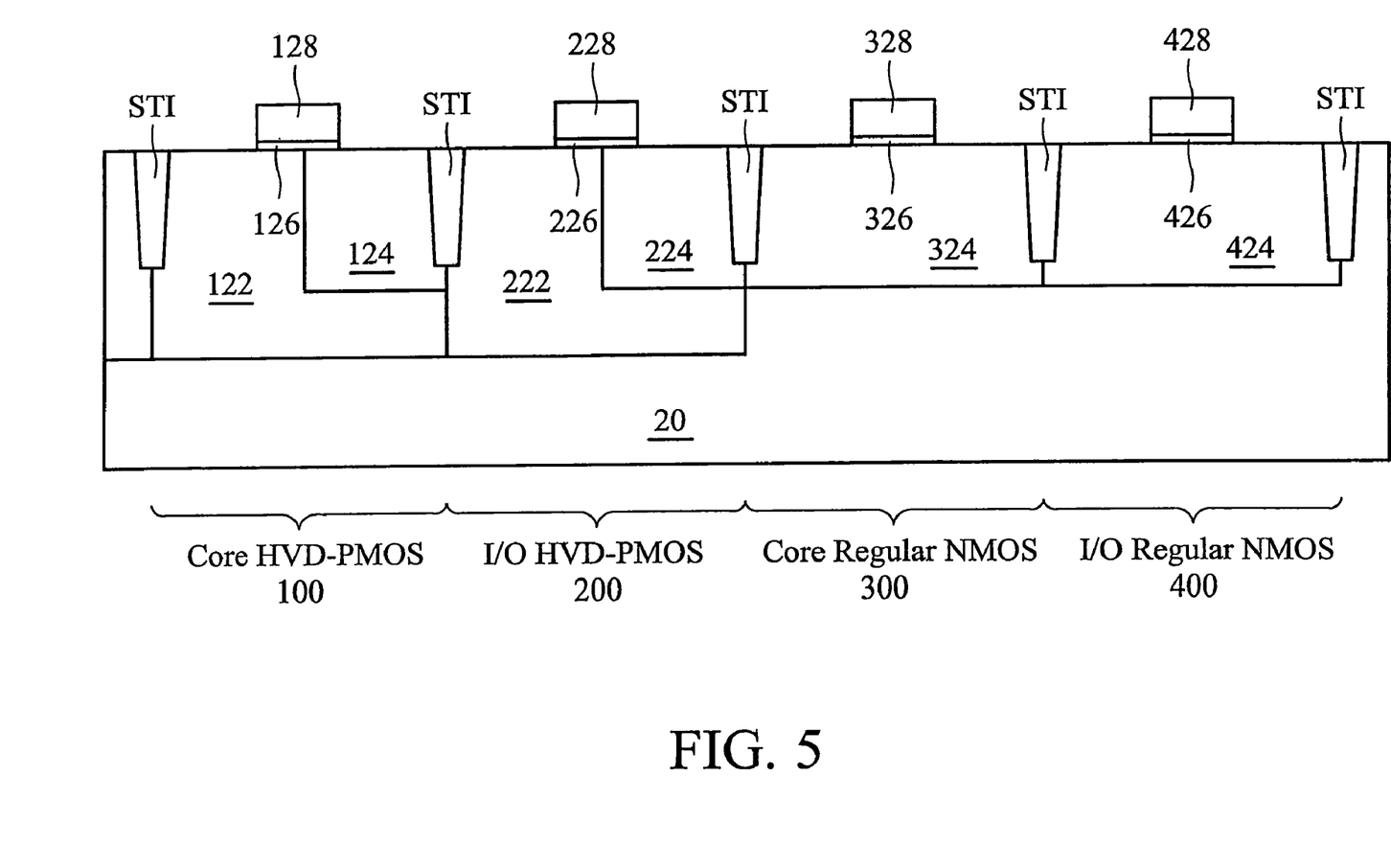

In FIG. 5, gate stacks of MOS devices are formed. Preferably, gate dielectrics 126 and 326 of the respective core HVD-PMOS device and core regular NMOS device comprise thin oxide or high-k dielectric materials, while gate dielectrics 226 and 426 of the respective I/O HVD-PMOS device and I/O regular NMOS device comprise thick oxides or high-k dielectric materials. However, the materials of the gate dielectrics can use any of the commonly used dielectric materials, depending on design requirements. On the other hand, gate electrodes 128, 228, 328 and 428 preferably comprise silicon, metals, metal silicides, and metal nitrides. Again, depending on design requirements, different materials can be used. The formation processes of the gate stacks are well known in the art, thus are not repeated herein.

Figure 6A:
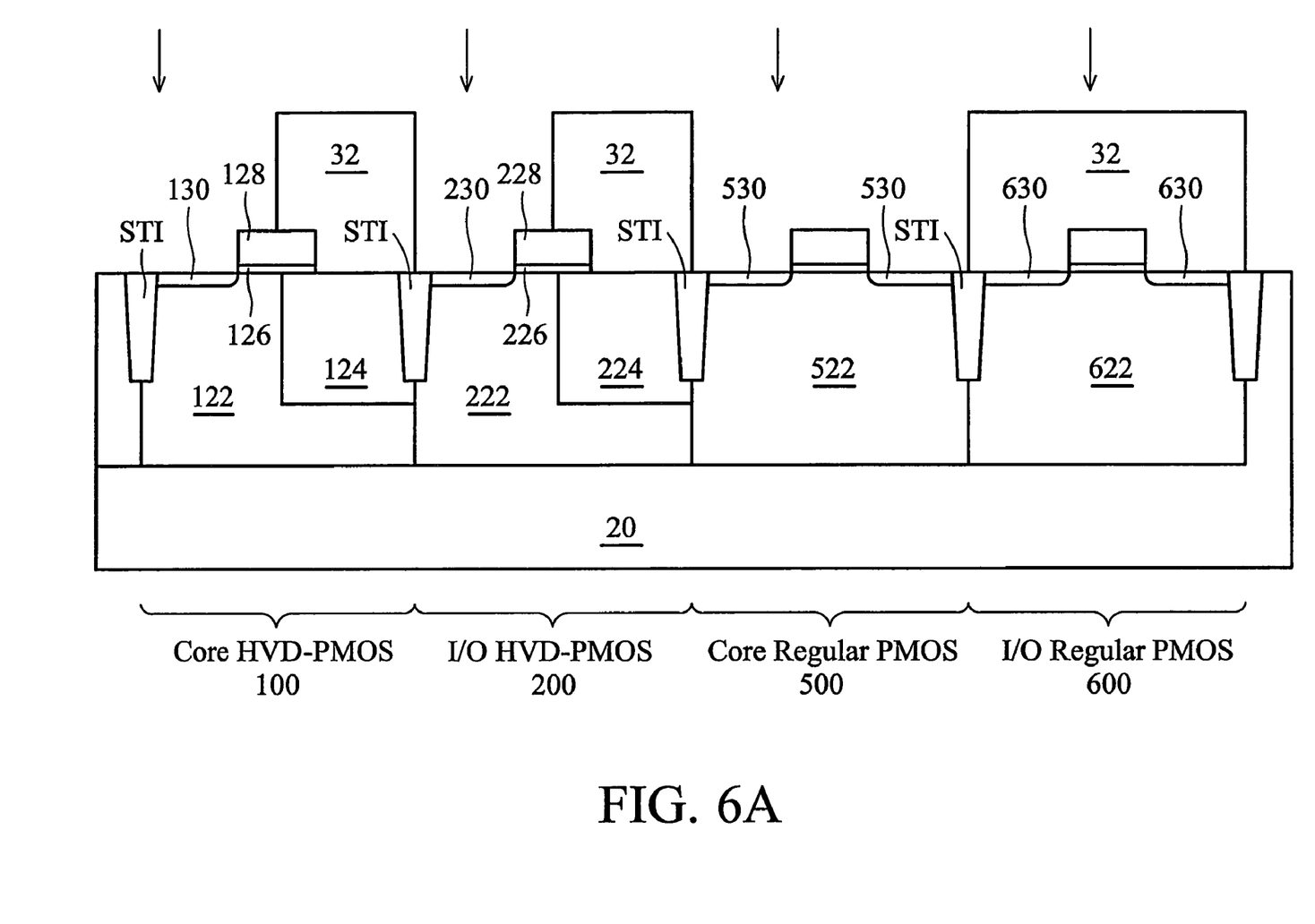

Lightly-doped source/drain (LDD) regions are then formed. FIG. 6A illustrates a first embodiment for forming LDD regions, wherein a core regular PMOS region 500 and an I/O regular PMOS region 600 are illustrated instead of regular NMOS regions 300 and 400. A photo resist 32 masks the drain sides of core HVD-PMOS device region 100 and I/O HVD-PMOS device region 200. In addition, region 600 is also masked. An implantation of p-type impurities is then performed. As a result, LDD regions 130 and 230 of respective core HVD-PMOS and I/O HVD-PMOS devices are formed simultaneously with the formation of LDD regions 530 of the core regular PMOS device in region 500. LDD regions 130 and 230 preferably have an impurity concentration at least one order greater than the impurity concentration of embedded P-well regions 124 and 224, and more preferably about two orders greater or higher. Photo resist 32 is then removed.

Figure 6B:
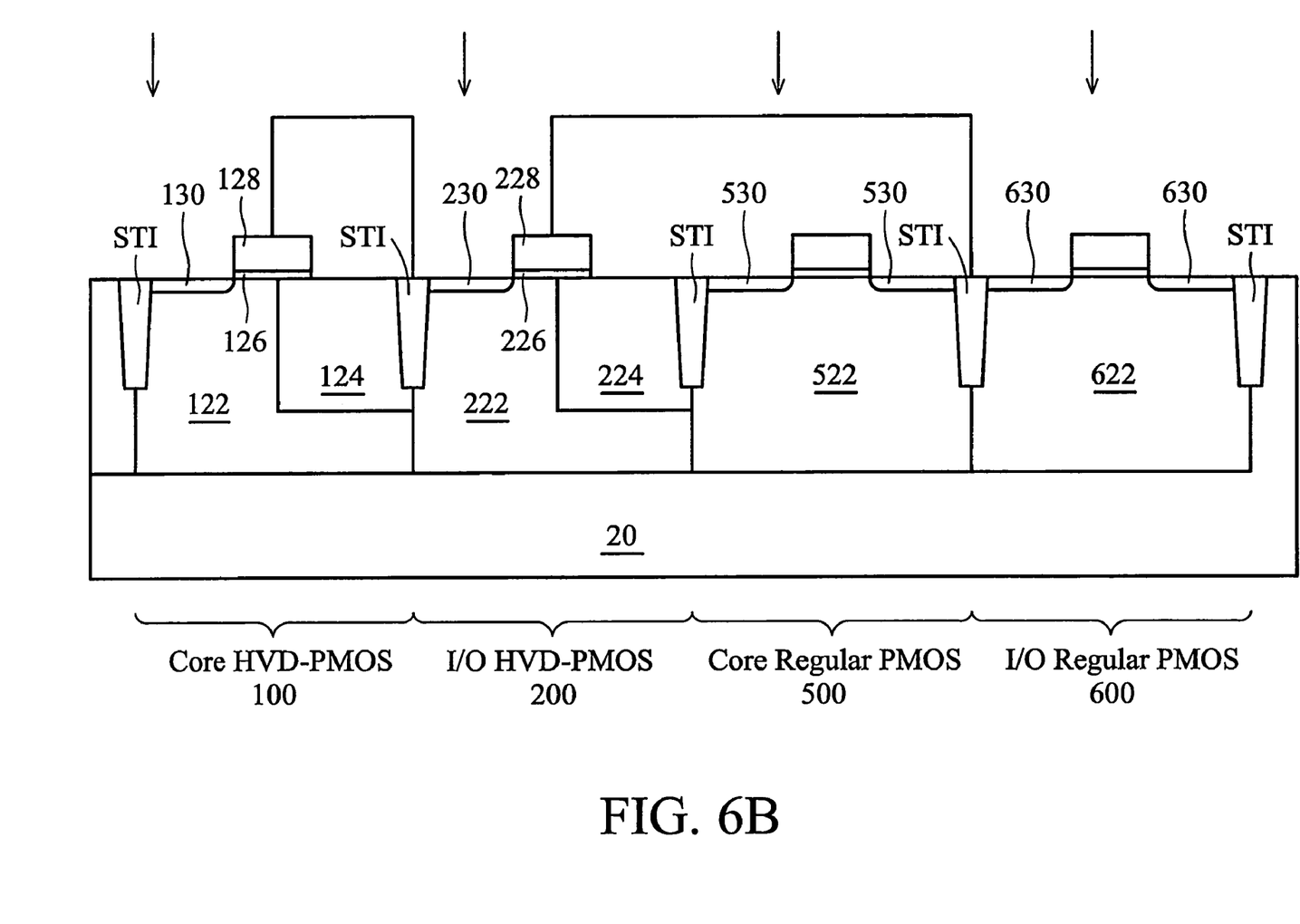

In other embodiments of the present invention, each of the LDD regions 130 and 230 are formed simultaneously with the formation of LDD regions 630 of an I/O regular PMOS device in region 600. FIG. 6B illustrates an exemplary formation process.

Figure 6C:
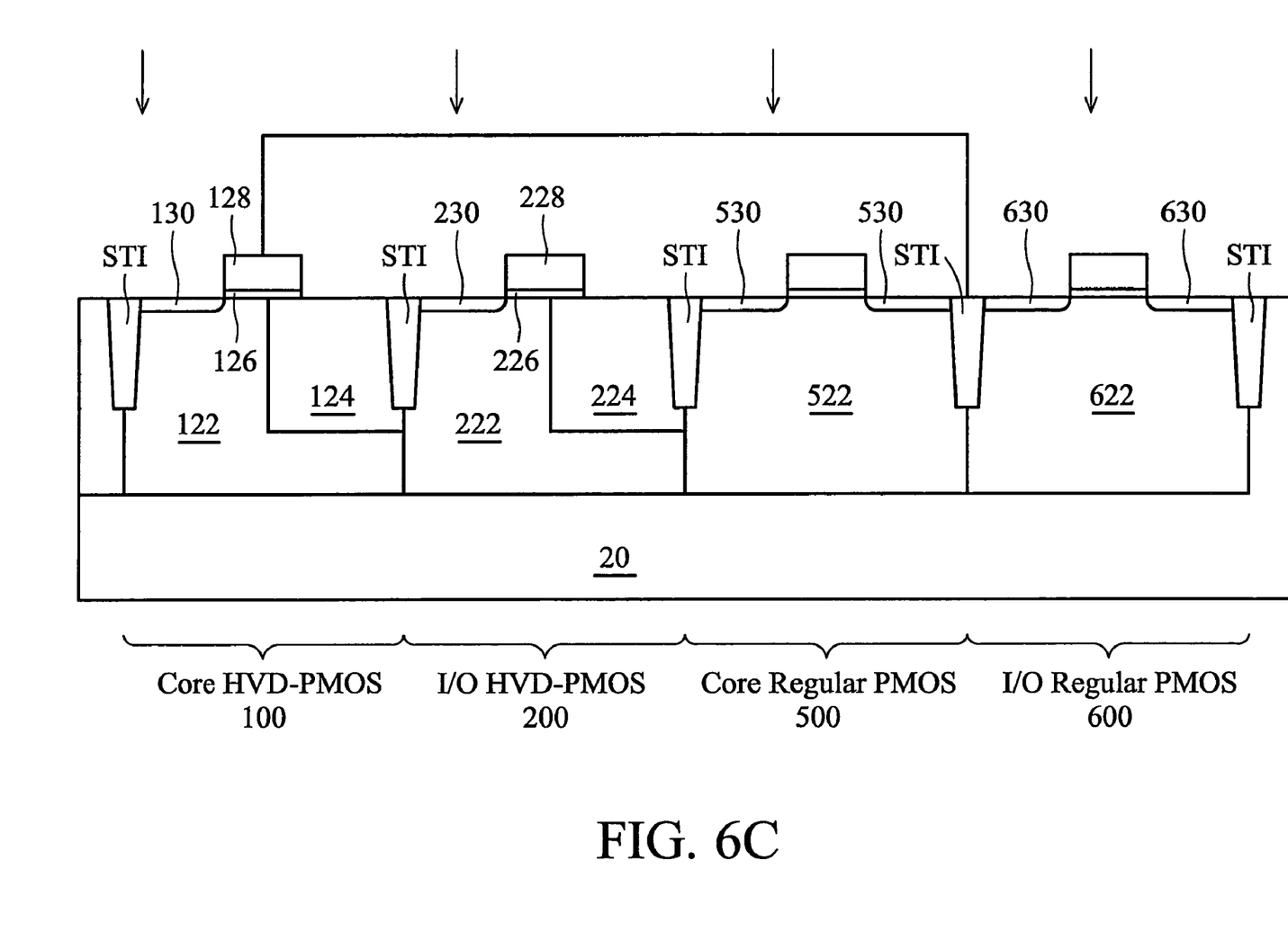

In yet other embodiments of the present invention, each of the LDD regions 130 and 230 may be formed simultaneously with any of the LDD regions 530 and 630 in any combination. FIG. 6C illustrates a further example, in which LDD region 130 is formed simultaneously with LDD region 630. LDD region 230 may be formed simultaneously with LDD region 530. In yet other embodiments, LDD region 230 is formed simultaneously with LDD region 630, while LDD region 130 is formed simultaneously with LDD region 530. One skilled in the art will realize that by forming LDD regions 130 and 230 simultaneously with different devices, LDD regions 130 and 230 will have different impurity concentrations, depths, etc., and the resulting core HVD-PMOS device and I/O HVD-PMOS device will have customized characteristics.

Figure 7:
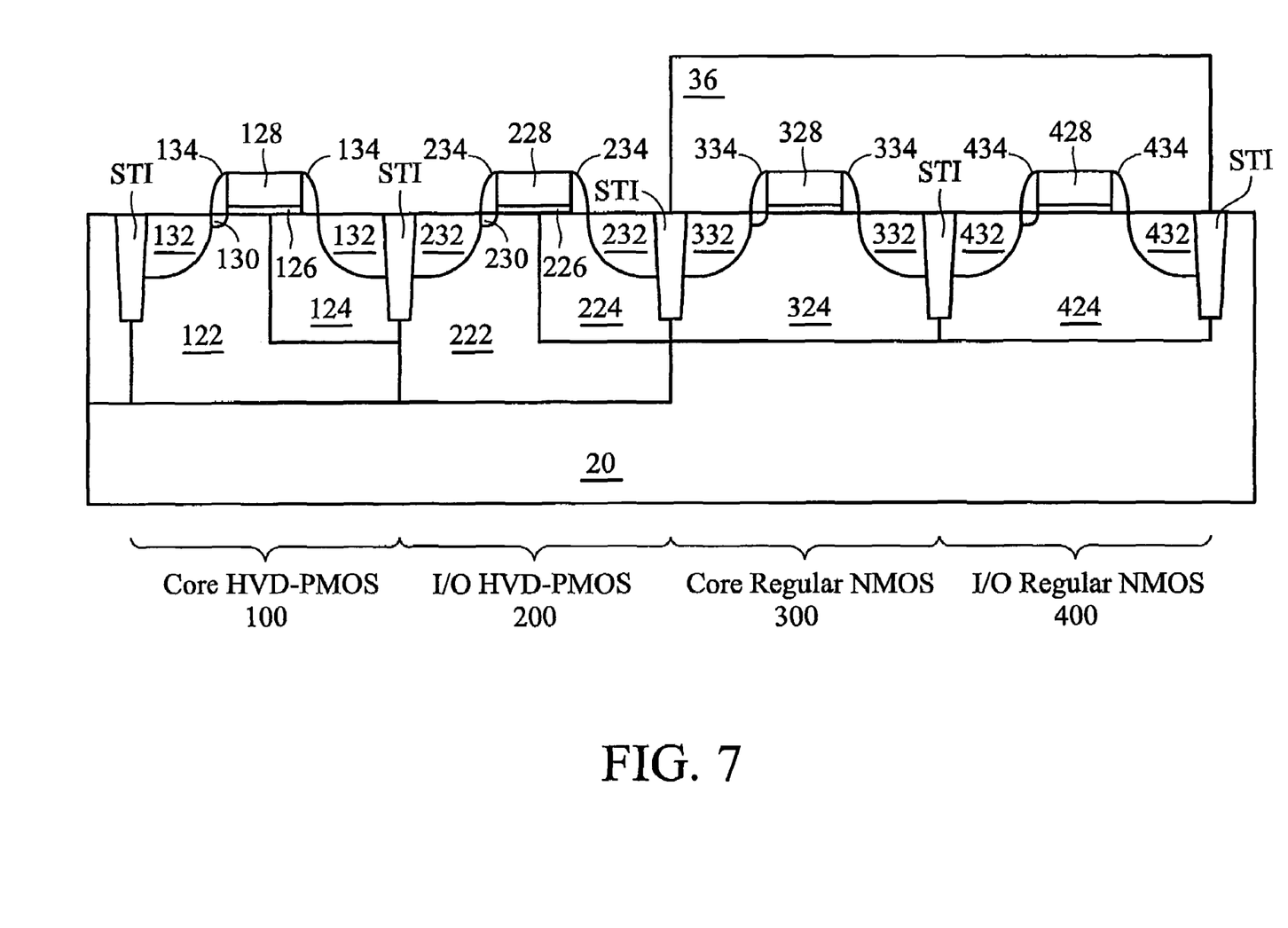

Referring to FIG. 7, gate spacers and deep source/drain regions are formed, wherein regions 100, 200, 300 and 400 are illustrated. The formation of gate spacers 134, 234, 334 and 434 and source/drain regions 132, 232, 332 and 432 are well known in the art, and thus are not repeated herein. In an exemplary embodiment as shown in FIG. 7, source/drain regions 132 and 232 of the HVD-PMOS device and are formed by forming a photo resist 36 to mask regions 300 and 400, and implanting p-type impurities. Source/drain regions 132 and 232 are thus substantially aligned with gate spacer 134 and 234, respectively. Photo resist 36 is then removed. For process simplicity, the source/drain process will be formed simultaneously for HVD-PMOS devices and regular PMOS devices. Source/drain regions 332 and 432 are similarly formed, except the implanted impurities are of n-type.

Figure 8A:
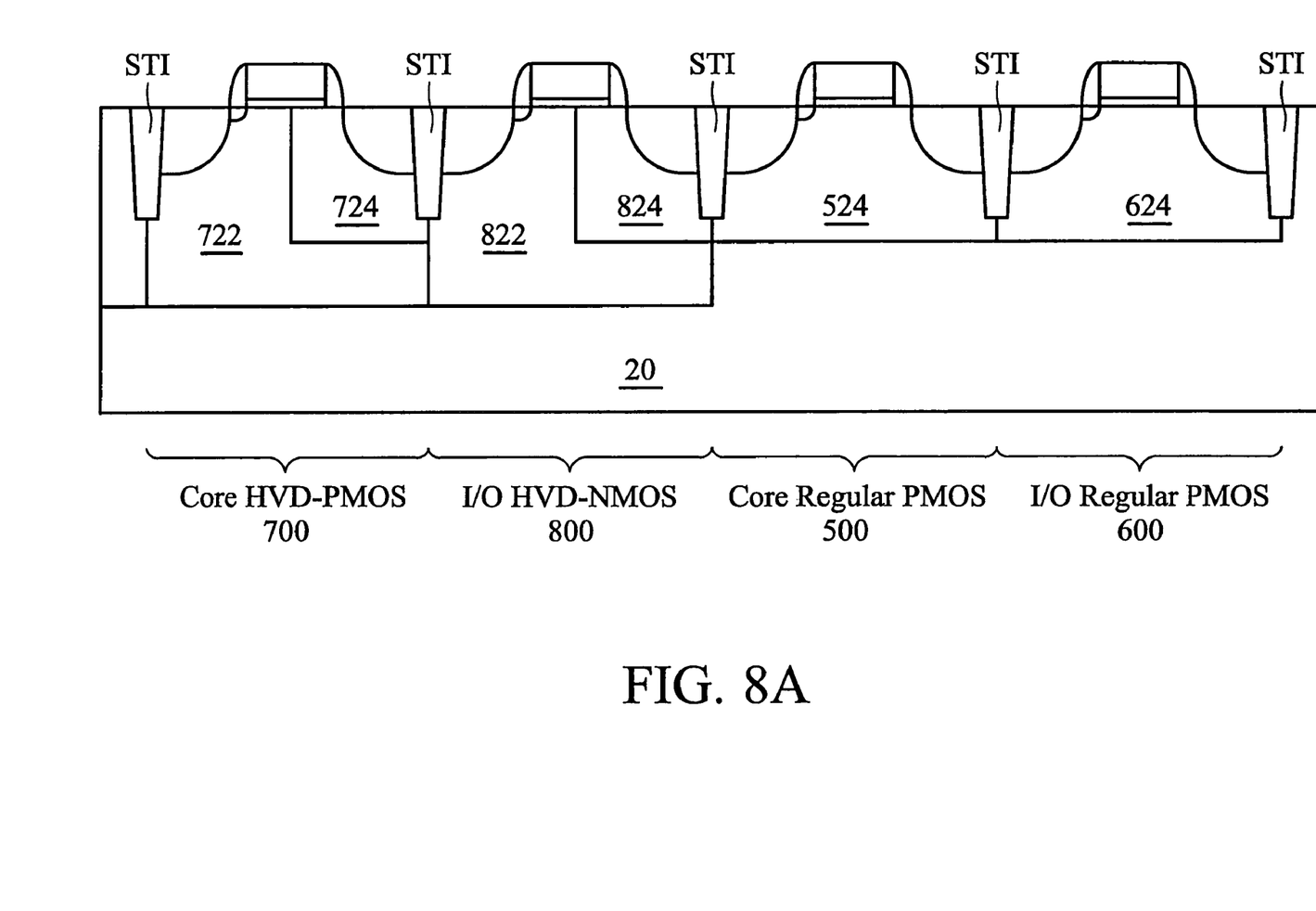
FIGS. 8A and 8B are cross-sectional views of an n-type core HVD-MOS device and an n-type I/O HVD-MOS device.
Figure 8B:
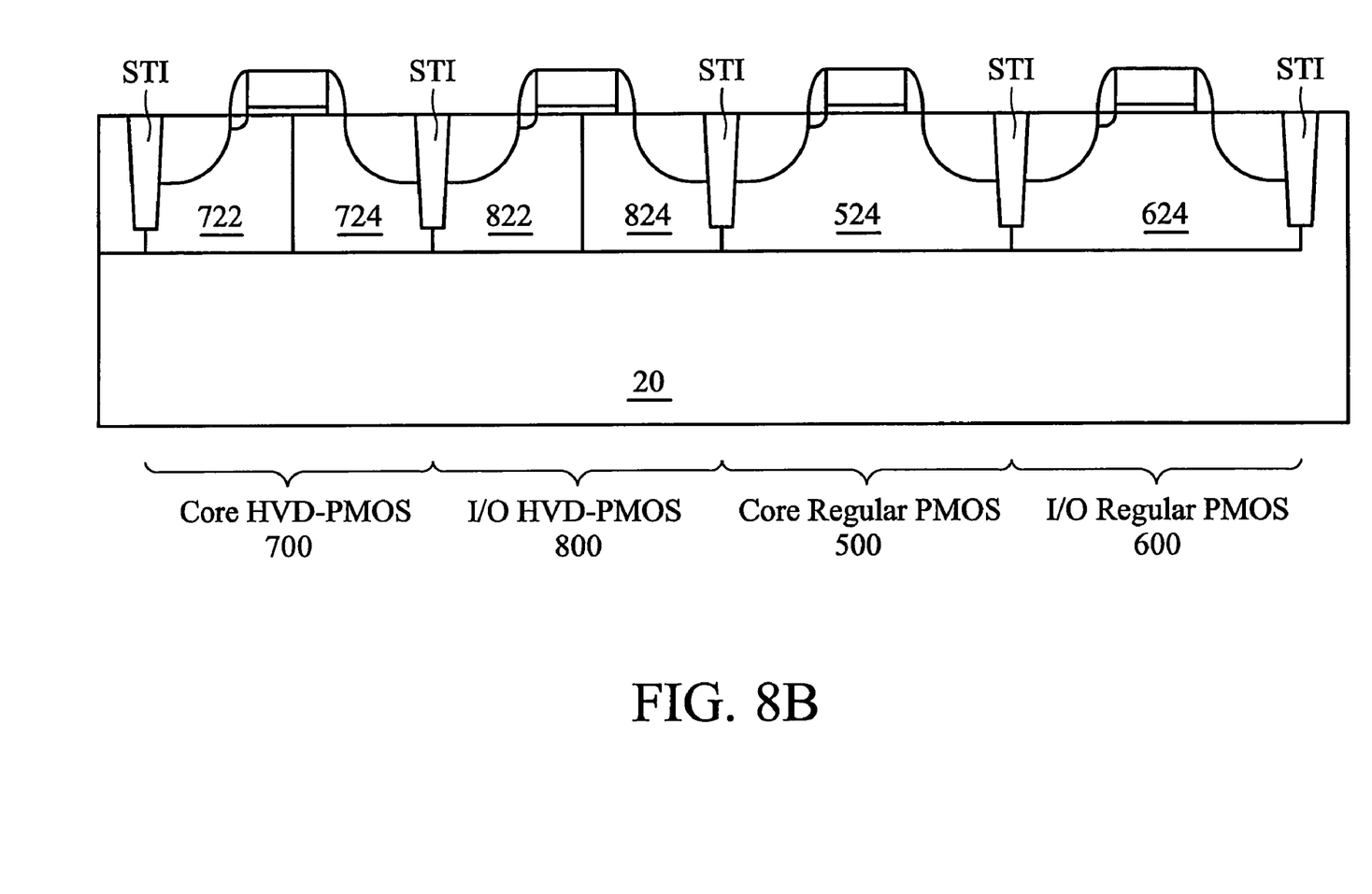

The preceding paragraphs discuss the formation of core HVD-PMOS devices and I/O HVD-PMOS devices. FIGS. 8A and 8B illustrate cross-sectional views of a core HVD-NMOS device and an I/O HVD-NMOS device. Referring to FIG. 8A, substrate 20 preferably includes core HVD-NMOS device region 700, I/O HVD-NMOS device region 800, core regular PMOS device region 500 and I/O regular PMOS device region 600 (please also refer to FIG. 7 for regions 500 and 600). Preferably, embedded N-well regions 724 and 824 are double-dosed when N-well regions 524 and 624 of the respectively core regular PMOS device and I/O regular PMOS device are formed. The process steps for forming core HVD-NMOS devices and I/O HVD-NMOS devices are similar to those shown in FIGS. 2 through 7, except the conductivity type of the respective well regions, embedded well regions, LDD regions and deep source/drain regions are inverted.

An alternative embodiment for forming a core HVD-NMOS device and an I/O HVD-NMOS device is shown in FIG. 8B. As embedded N-well regions 724 and 824 have a different conductivity type than substrate 20, embedded N-well regions 724 and 824 may adjoin p-substrate 20. Accordingly, P-well regions 722 and 822 and embedded regions 724 and 824 may have a similar depth.

Figure 9:
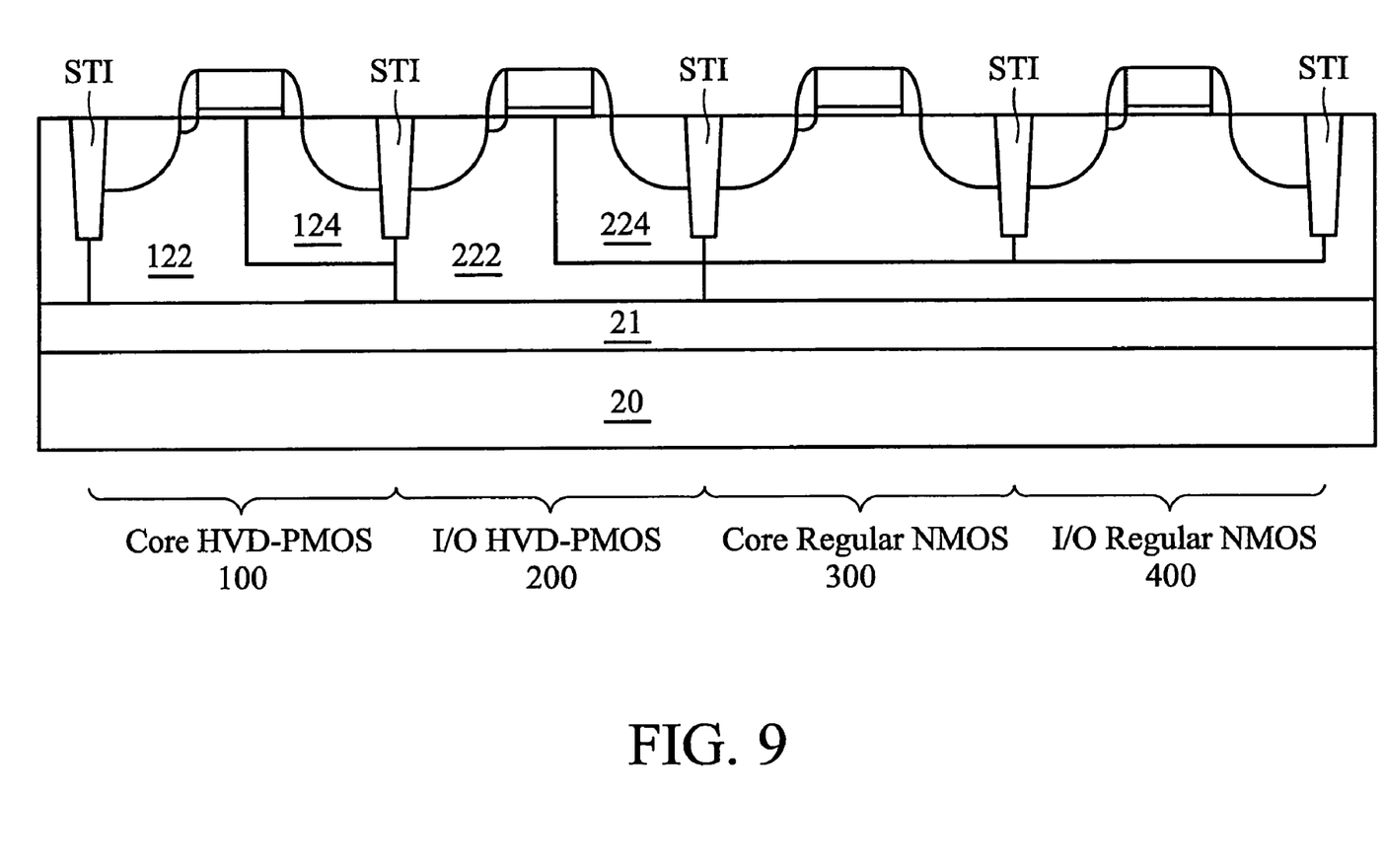
FIG. 9 illustrates a cross-sectional view of a core HVD-MOS device and an I/O HVD-MOS device formed over an N+ buried layer.

FIG. 9 illustrates a further embodiment of the present invention, wherein an N+ buried layer (NBL) 21 is formed between substrate 20 and the overlying devices. NBL 21 is preferably formed by implanting dopants into the top surface of the substrate 20. For example, antimony, arsenic and/or phosphorus may be implanted. NBL 21 acts as an electrical isolation region, isolating the devices subsequently formed over NBL 21 from substrate 20. An epitaxial layer is then grown on NBL 21. STI regions are then formed, and p-type and n-type impurities are doped to form well regions and embedded well regions using essentially the same process steps as shown starting in FIG. 2. Deep N-well process may also be performed as an alternative way to isolate HVD-PMOS devices from substrate 20.

The embodiments of the present invention have several advantageous features. Preferably, after gate stacks are formed, source-side LDD regions for HVD-MOS devices may be formed simultaneously with the LDD regions of regular MOS devices. Source-side LDD regions of HVD-MOS devices can also be formed in any combination with the formation of regular core and I/O LDD drains. As compared with regular MOS devices, drain-side LDD regions of HVD-MOS devices are substituted with embedded well regions having light impurity concentrations, thus junction depths on drain-sides are increased. Therefore, part of the drain voltage drops across a depletion region in the lightly-doped embedded well region, resulting in an electric field lower than the breakdown electric field. Accordingly, the capability of sustaining higher voltages on drain sides is improved.

The preferred embodiments of the present invention utilize the existing CMOS formation steps and masks to form core HVD-MOS devices and I/O HVD-MOS devices, and thus the additional cost is low. LDD regions of the HVD-MOS devices may be customized to design requirements without additional cost. The formation processes are fully compatible with existing CMOS processes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   providing a semiconductor substrate;
   forming a high-voltage drain metal-oxide-semiconductor (HVD-MOS) device at a surface of the semiconductor substrate comprising:
   forming a well region of a first conductivity type in the semiconductor substrate;
   forming an embedded well region in the well region and on a drain side of the HVD-MOS device, wherein the embedded well region is of a second conductivity type opposite the first conductivity type, and wherein the step of forming the embedded well region comprises:
   performing a first doping step to simultaneously dope the embedded well region and a well region of a core regular MOS device, wherein the core regular MOS device is of the first conductivity type; and
   performing a second doping step to simultaneously dope the embedded well region and a well region of an I/O regular MOS device, wherein the I/O regular MOS device is of the first conductivity type, wherein during the first doping step, the well region of the I/O regular MOS device is not doped, and wherein during the second doping step, the well region of the core regular MOS device is not doped; and forming a gate stack extending from over the embedded well region to over the well region.

2. The method of claim 1, wherein the HVD-MOS device is a core HVD-MOS device.

3. The method of claim 1, wherein the HVD-MOS device is an I/O HVD-MOS device.

4. The method of claim 1, wherein the HVD-MOS device is a HVD-PMOS device, and wherein the first conductivity type is n-type and the second conductivity type is p-type.

5. The method of claim 1, wherein the HVD-MOS device is a HVD-NMOS device, and wherein the first conductivity type is p-type and the second conductivity type is n-type.

6. The method of claim 1 further comprising implanting a lightly-doped source region adjacent the gate stack after the step of forming the gate stack, wherein the lightly-doped source region is simultaneously doped with a lightly-doped region of a MOS device selected from the group consisting essentially of the core regular MOS device and the I/O regular MOS device, and wherein no lightly-doped drain region is formed for the HVD-MOS device.

7. The method of claim 1, wherein the HVD-MOS device is a HVD-PMOS device, wherein the method further comprises performing an additional implantation to deepen the well region, and wherein during the step of the additional implantation, the embedded well region is not deepened.

8. The method of claim 1, wherein the HVD-MOS device is a HVD-NMOS device, and wherein the well region has a depth similar to the embedded well region.

9. A method of forming a semiconductor structure, the method comprising:
    providing a semiconductor substrate comprising a first region and a second region;
    forming a core high-voltage drain metal-oxide-semiconductor (HVD-MOS) device in the first region and an I/O HVD-MOS device in the second region comprising:
        forming a first well region for the core HVD-MOS device in the first region;
        forming a second well region for the I/O HVD-MOS device in the second region, wherein the first and the second well regions are of a first conductivity type;
        forming a first embedded well region in the first well region and only on a drain side of the core HVD-MOS device;
        forming a second embedded well region in the second well region and only on a drain side of the I/O HVD-MOS device, wherein the first and the second embedded well regions are of a second conductivity type opposite the first conductivity type, and wherein the steps of forming the first and the second embedded well regions comprise:
            performing a first doping step to simultaneously dope the first and the second embedded well regions and a well region of a core regular MOS device, wherein the core regular MOS device is of the first conductivity type; and
            performing a second doping step to simultaneously dope the first and the second embedded well regions and a well region of an I/O regular MOS device, wherein the I/O regular MOS device is of the first conductivity type, wherein during the first doping step, the well region of the I/O regular MOS device is not doped, and wherein during the second doping step, the well region of the core regular MOS device is not doped;
        forming a first gate stack over and extending from the first embedded well region to the first well region; and
        forming a second gate stack over and extending from the second embedded well region to the second well region.

10. The method of claim 9 further comprising:
    implanting a first lightly-doped source region adjacent the first gate stack after the step of forming the first gate stack; and
    implanting a second lightly-doped source region adjacent the first gate stack after the step of forming the second gate stack, wherein each of the first and the second lightly-doped source regions are simultaneously doped with a lightly-doped region of a MOS device selected from the group consisting essentially of the core regular MOS device and the I/O regular MOS device, and wherein no lightly-doped drain regions are formed for the core HVD-MOS device and the I/O HVD-MOS device.

11. The method of claim 10, wherein impurities of the second conductivity type in the first and the second embedded well regions have a first impurity concentration, and impurities of the second conductivity type in the first and the second lightly-doped source regions have a second impurity concentration, and wherein the first impurity concentration is lower than the second impurity concentration by a difference greater than about two orders.

12. The method of claim 9, wherein the steps of forming the first and the second well regions comprise additional implantation steps to increase depths of the first and the second well regions over depths of the respective first and second embedded well regions.

13. The method of claim 12, wherein during the additional implantation steps, the first and the second embedded well regions are not implanted.

14. The method of claim 9, wherein the core HVD-MOS device and the I/O HVD-MOS device are PMOS devices, and wherein the core regular MOS device and the I/O regular MOS device are NMOS devices.

15. The method of claim 9, wherein the core HVD-MOS device and the I/O HVD-MOS device are NMOS devices, and wherein the core regular MOS device and the I/O regular MOS device are PMOS devices.

16. The method of claim 9 further comprising forming an N+ buried layer underlying the first and the second well regions and the first and the second embedded well regions.

* * * * *